(12) United States Patent
Ichikawa et al.

(10) Patent No.: US 11,355,783 B2
(45) Date of Patent: Jun. 7, 2022

(54) METHOD OF MANUFACTURING A LITHIUM-ION SECONDARY BATTERY

(71) Applicant: Envision AESC Japan Ltd., Zama (JP)

(72) Inventors: Tomoyuki Ichikawa, Kanagawa (JP); Shinsuke Enomoto, Kanagawa (JP); Naoyuki Iwata, Kanagawa (JP)

(73) Assignee: ENVISION AESC JAPAN LTD., Zama (JP)

( * ) Notice: Subject to any disclaimer, the term of this patent is extended or adjusted under 35 U.S.C. 154(b) by 228 days.

(21) Appl. No.: 15/735,791

(22) PCT Filed: Jun. 15, 2016

(86) PCT No.: PCT/JP2016/067758
§ 371 (c)(1),
(2) Date: Dec. 12, 2017

(87) PCT Pub. No.: WO2017/002615
PCT Pub. Date: Jan. 5, 2017

(65) Prior Publication Data
US 2018/0183091 A1 Jun. 28, 2018

(30) Foreign Application Priority Data
Jul. 1, 2015 (JP) .............................. JP2015-132834

(51) Int. Cl.
*G01R 31/28* (2006.01)
*H01M 10/058* (2010.01)
(Continued)

(52) U.S. Cl.
CPC ...... *H01M 10/058* (2013.01); *G01R 31/3865* (2019.01); *H01M 4/0447* (2013.01);
(Continued)

(58) Field of Classification Search
CPC .. H01M 4/0447; H01M 10/058; H01M 10/42; H01M 10/0525; H01M 10/0566; G01R 31/3865; G01R 31/50
See application file for complete search history.

(56) References Cited

U.S. PATENT DOCUMENTS 9,755,238 B2 * 9/2017 Onizuka ............. H01M 4/0404
9,887,420 B2 * 2/2018 Park ...................... H01M 4/485
(Continued)

FOREIGN PATENT DOCUMENTS

| CN | 102035025 A | 4/2011 |
|---|---|---|
| JP | 11-111267 A | 4/1999 |

(Continued)

OTHER PUBLICATIONS

First Office Action dated Sep. 29, 2019 from the China National Intellectual Property Administration Machine in application No. 201680038932.2.
(Continued)

*Primary Examiner* — Paul D Kim
(74) *Attorney, Agent, or Firm* — Sughrue Mion, PLLC

(57) ABSTRACT

A method of manufacturing a lithium-ion secondary battery of the present invention includes at least four steps as follows: an initial charging step of charging the lithium-ion secondary battery, which has not been subjected to initial charging, under a temperature environment ranging of equal to or higher than −20° C. and equal to or lower than 15° C.; an aging step of leaving the lithium-ion secondary battery under a temperature environment ranging of equal to or higher than 30° C. and equal to or lower than 80° C. after the initial charging step; a short circuit detecting step of detecting the presence or absence of a short circuit of the lithium-ion secondary battery by measuring a voltage drop quantity of the lithium-ion secondary battery and comparing the voltage drop quantity with a reference value; and a sorting
(Continued)

step of sorting out a lithium-ion secondary battery in which no short circuit is detected.

14 Claims, 4 Drawing Sheets

(51) Int. Cl.
    *H01M 10/0566* (2010.01)
    *G01R 31/385* (2019.01)
    *H01M 10/42* (2006.01)
    *H01M 4/04* (2006.01)
    *H01M 10/0525* (2010.01)
    *G01R 31/52* (2020.01)

(52) U.S. Cl.
    CPC ... *H01M 10/0525* (2013.01); *H01M 10/0566* (2013.01); *H01M 10/42* (2013.01); *G01R 31/52* (2020.01); *H01M 2300/0037* (2013.01)

(56) References Cited

U.S. PATENT DOCUMENTS

| | | | | |
|---|---|---|---|---|
| 9,960,452 B2* | 5/2018 | Ueno | ................... | H01M 4/625 |
| 2006/0222940 A1 | 10/2006 | Fujikawa et al. | | |

FOREIGN PATENT DOCUMENTS

| | | | | |
|---|---|---|---|---|
| JP | 2004-234896 | A | | 8/2004 |
| JP | 2005-209528 | A | | 8/2005 |
| JP | 2005209528 | A | * | 8/2005 |
| JP | 2007-042580 | A | | 2/2007 |
| JP | 2014-082063 | A | | 5/2014 |
| JP | 2014-086293 | A | | 5/2014 |
| JP | 2014-222603 | A | | 11/2014 |
| JP | 2015-095333 | A | | 5/2015 |
| JP | 2015-219971 | A | | 12/2015 |

OTHER PUBLICATIONS

International Search Report for PCT/JP2016/067758 dated Aug. 16, 2016 [PCT/ISA/210].

* cited by examiner

METHOD OF MANUFACTURING A LITHIUM-ION SECONDARY BATTERY

CROSS REFERENCE TO RELATED APPLICATIONS

This application is a National Stage of International Application No. PCT/JP2016/067758 filed Jun. 15, 2016, claiming priority based on Japanese Patent Application No. 2015-132834 filed Jul. 1, 2015, the contents of all of which are incorporated herein by reference in their entirety.

TECHNICAL FIELD

The present invention relates to a method of manufacturing a lithium-ion secondary battery and a method of evaluating a lithium-ion secondary battery.

BACKGROUND ART

In a case where a conductive foreign substance such as metal is incorporated in a lithium-ion secondary battery, there is a possibility that a short circuit will occur between positive and negative electrodes when the lithium-ion secondary battery is in use, resulting in a voltage drop or heat generation.

Therefore, in a step of manufacturing a lithium-ion secondary battery, a battery having a conductive foreign substance incorporated therein is detected and the battery is appraised as a defective unit and is removed from a product.

For example, Patent Document 1 (Japanese Unexamined Patent Publication No. 2005-209528) discloses a technology of detecting a conductive foreign substance incorporated in a lithium-ion secondary battery.

Patent Document 1 discloses a method of inspecting a secondary battery including an initial charging step of performing initial charging of a secondary battery at a predetermined temperature by localizing metal impurities on an electrode and causing the metal impurities to be precipitated, and a micro-short detecting step of detecting a micro-short between a positive electrode and a negative electrode after the initial charging step.

RELATED DOCUMENT

Patent Document

[Patent Document 1] Japanese Unexamined Patent Publication No. 2005-209528

SUMMARY OF THE INVENTION

Technical Problem

Upon investigation of the inventors, it has become clear that the method disclosed in Patent Document 1 has low sensitivity for detecting a conductive foreign, for example, it is not possible to detect a lithium-ion secondary battery, within a practical period of time, in which a minute amount of stainless steel having a high risk of being incorporated during a manufacturing step is incorporated.

The present invention has been made in consideration of the foregoing circumstances and provides a method of manufacturing a lithium-ion secondary battery capable of efficiently obtaining a highly reliable lithium-ion secondary battery in which a short circuit is unlikely to occur between positive and negative electrodes, and a method of evaluating a lithium-ion secondary battery capable of accurately detecting a lithium-ion secondary battery in which a short circuit is likely to occur between positive and negative electrodes.

Solution to Problem

According to the present invention, there is provided a method of manufacturing a lithium-ion secondary battery including an initial charging step of charging the lithium-ion secondary battery, which has not been subjected to initial charging, under a temperature environment ranging of equal to or higher than −20° C. and equal to or lower than 15° C.; an aging step of leaving the lithium-ion secondary battery under a temperature environment ranging of equal to or higher than 30° C. and equal to or lower than 80° C. after the initial charging step; a short circuit detecting step of detecting the presence or absence of a short circuit of the lithium-ion secondary battery by measuring a voltage drop quantity of the lithium-ion secondary battery and comparing the voltage drop quantity with a reference value; and a sorting step of sorting out a lithium-ion secondary battery in which no short circuit is detected.

Moreover, according to the present invention, there is provided a method of manufacturing a lithium-ion secondary battery including an initial charging step of charging the lithium-ion secondary battery, which has not been subjected to initial charging, under a condition in which viscosity of an electrolytic solution is equal to or higher than 6.0 mPa·s; an aging step of leaving the lithium-ion secondary battery under a condition in which viscosity of an electrolytic solution is equal to or lower than 4.5 mPa·s after the initial charging step; a short circuit detecting step of detecting the presence or absence of a short circuit of the lithium-ion secondary battery by measuring a voltage drop quantity of the lithium-ion secondary battery and comparing the voltage drop quantity with a reference value; and a sorting step of sorting out a lithium-ion secondary battery in which no short circuit is detected.

Moreover, according to the present invention, there is provided a method of evaluating a lithium-ion secondary battery including a charging step of charging the lithium-ion secondary battery under a temperature environment ranging of equal to or higher than −20° C. and equal to or lower than 15° C., an aging step of leaving the lithium-ion secondary battery under a temperature environment ranging of equal to or higher than 30° C. and equal to or lower than 80° C. after the charging step, and a short circuit detecting step of detecting the presence or absence of a short circuit of the lithium-ion secondary battery by measuring a voltage drop quantity of the lithium-ion secondary battery and comparing the voltage drop quantity with a reference value.

Moreover, according to the present invention, there is provided a method of evaluating a lithium-ion secondary battery including a charging step of charging the lithium-ion secondary battery under a condition in which viscosity of an electrolytic solution is equal to or higher than 6.0 mPa·s, an aging step of leaving the lithium-ion secondary battery under a condition in which viscosity of an electrolytic solution is equal to or lower than 4.5 mPa·s after the charging step, and a short circuit detecting step of detecting the presence or absence of a short circuit of the lithium-ion secondary battery by measuring a voltage drop quantity of the lithium-ion secondary battery and comparing the voltage drop quantity with a reference value.

Advantageous Effects of Invention

According to the present invention, it is possible to provide the method of manufacturing a lithium-ion secondary battery capable of efficiently obtaining a highly reliable lithium-ion secondary battery in which a short circuit is unlikely to occur between positive and negative electrodes, and the method of evaluating a lithium-ion secondary battery capable of accurately detecting a lithium-ion secondary battery in which a short circuit is likely to occur between positive and negative electrodes.

BRIEF DESCRIPTION OF THE DRAWINGS

The objects, other objects, the features, and the advantages described above become clearer by preferable embodiments and the accompanying drawings described below.

DESCRIPTION OF EMBODIMENTS

Hereinafter, embodiments of the present invention will be described using the drawings. In all of the drawings, common reference signs will be applied to similar constituent elements, and description will not be repeated. Unless otherwise noted, "to" between numbers in sentences indicates a range of equal to or more than a number and equal to or less than the other number.

First Embodiment: Method of Manufacturing Lithium-Ion Secondary Battery

Figure 1:
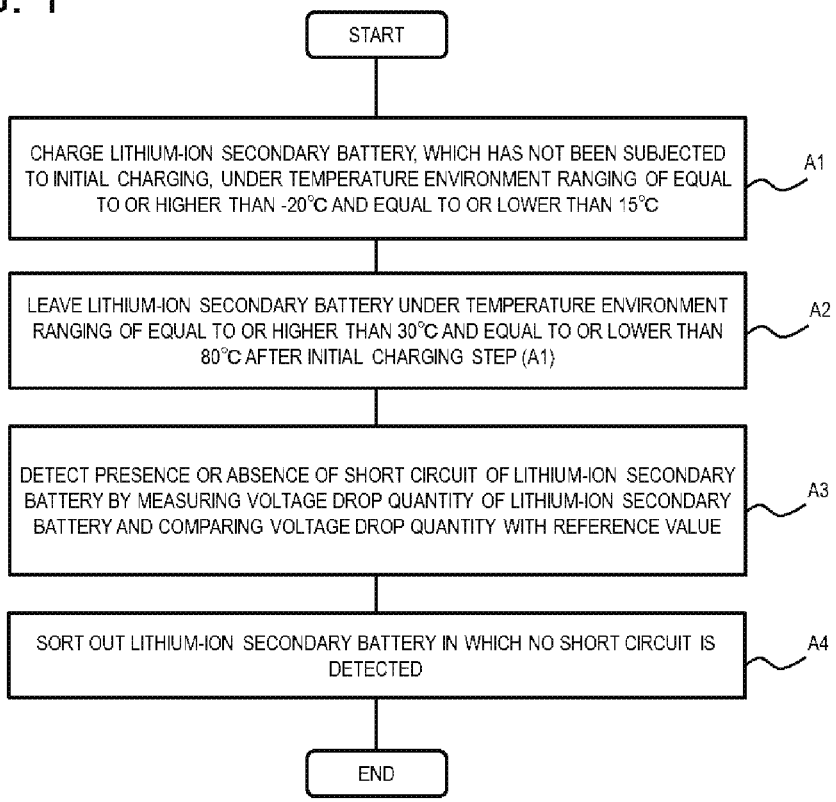
FIG. 1 is a flow chart illustrating an example of a method of manufacturing a lithium-ion secondary battery according to a first embodiment.

First, a method of manufacturing a lithium-ion secondary battery according to a first embodiment will be described. FIG. 1 is a flow chart illustrating an example of the method of manufacturing a lithium-ion secondary battery according to the first embodiment.

The method of manufacturing a lithium-ion secondary battery of the present embodiment includes at least four steps (A1) to (A4) as follows:

(A1) an initial charging step of charging the lithium-ion secondary battery, which has not been subjected to initial charging, under a temperature environment ranging of equal to or higher than −20° C. and equal to or lower than 15° C.;

(A2) an aging step of leaving the lithium-ion secondary battery under a temperature environment ranging of equal to or higher than 30° C. and equal to or lower than 80° C. after the initial charging step (A1);

(A3) a short circuit detecting step of detecting the presence or absence of a short circuit of the lithium-ion secondary battery by measuring a voltage drop quantity of the lithium-ion secondary battery and comparing the voltage drop quantity with a reference value; and (A4) a sorting step of sorting out a lithium-ion secondary battery in which no short circuit is detected.

According to the method of manufacturing a lithium-ion secondary battery of the present embodiment, when at least the four steps (A1) to (A4) described above are included, a lithium-ion secondary battery having a conductive foreign substance incorporated therein can be detected with high sensitivity, so that it is possible to efficiently obtain a lithium-ion secondary battery in which a short circuit is unlikely to occur between positive and negative electrodes.

Upon investigation of the inventors, it has become clear that the method disclosed in Patent Document 1 has low sensitivity for detecting a conductive foreign, for example, it is not possible to detect a lithium-ion secondary battery, within a practical period of time, in which a minute amount of stainless steel having a high risk of being incorporated during a manufacturing step is incorporated.

Thus, the inventors have intensively and repetitively investigated in order to achieve the objects described above. As a result, it has been found that sensitivity for detecting a conductive foreign substance inside a lithium-ion secondary battery is improved by respectively performing the initial charging step (A1) and the aging step (A2) within particular temperature ranges, and the present invention has been completed.

That is, in the method of manufacturing a lithium-ion secondary battery of the present embodiment, as described above, the ambient temperatures in the initial charging step (A1) and the aging step (A2) are respectively adjusted to particular ranges. It is assumed that when the ambient temperature in the initial charging step (A1) is within the range described above, seed crystal of a precipitate of a conductive foreign substance can be formed in an acute-angled manner. In addition, it is assumed that when the ambient temperature in the aging step (A2) is within the range described above, the seed crystal can grow effectively while the acute-angled form is maintained.

For the reason described above, according to the method of manufacturing a lithium-ion secondary battery of the present embodiment, it is possible to efficiently detect and eliminate a lithium-ion secondary battery in which a conductive foreign substance, such as stainless steel that is difficult to be detected by a detection technology in the related art, having a high risk of being incorporated during a manufacturing step is incorporated. That is, according to the method of manufacturing a lithium-ion secondary battery of the present embodiment, it is possible to remove a lithium-ion secondary battery as a defective unit in which a short circuit occurs between the positive and negative electrodes due to a precipitate of a conductive foreign substance so that deterioration of battery performance is likely to occur in a later stage in a case where a force is applied such that the positive electrode and the negative electrode approach each other when in actual use or in a case of being used for a long period of time even though no defect has occurred at the time of inspection. Therefore, it is possible to efficiently obtain a highly reliable lithium-ion secondary battery in which a short circuit is unlikely to occur between the positive and negative electrodes.

Hereinafter, each of the steps will be described.

(Initial Charging Process (A1))

First, a lithium-ion secondary battery which has not been subjected to initial charging is charged under a temperature environment ranging of equal to or higher than −20° C. and equal to or lower than 15° C.

The initial charging step (A1) is a step in which a lithium-ion secondary battery in a state where assembling is completed (an electrolytic solution is injected, and the battery is sealed) is charged for the first time to a predetermined capacity. It is preferable that charging in the initial charging step (A1) is carried out by constant current/constant voltage charging (CCCV charging).

The ambient temperature in the initial charging step (A1) ranges of equal to or higher than −20° C. and equal to or lower than 15° C. However, the ambient temperature preferably ranges of equal to or higher than −10° C. and equal to or lower than 10° C. and more preferably ranges of equal to or higher than −8° C. and equal to or lower than 8° C. When the temperature in the initial charging step (A1) is equal to or lower than the upper limit value, it is assumed that seed crystal of a precipitate of a conductive foreign substance can be formed in an acuter-angled manner. In addition, when the temperature in the initial charging step (A1) is equal to or higher than the lower limit value, deterioration of the cell characteristics (particularly, charging and discharging capacity) of a lithium-ion secondary battery in the initial charging step (A1) can be further suppressed.

In addition, from the viewpoint of being able to improve sensitivity for detecting a conductive foreign substance, the viscosity of an electrolytic solution in the lithium-ion secondary battery in the initial charging step (A1) is preferably equal to or higher than 6.0 mPa·s and is more preferably equal to or higher than 7.0 mPa·s. In the first to fourth embodiments, as the viscosity of an electrolytic solution, viscosity measured by using a tuning fork viscometer (manufactured by SEKONIC CORPORATION, brand name: Visco Mate VM-100) is indicated.

It is assumed that when the viscosity of an electrolytic solution is equal to or higher than the lower limit value, diffusion of ion of a conductive foreign substance in the electrolytic solution is suppressed, and seed crystal of a precipitate of a conductive foreign substance can be formed in an acuter-angled manner, so that sensitivity for detecting a conductive foreign substance can be improved.

For example, the upper limit value for the viscosity of an electrolytic solution in the lithium-ion secondary battery in the initial charging step (A1) is equal to or lower than 15 mPa·s.

Here, the viscosity of an electrolytic solution in the lithium-ion secondary battery can be adjusted by adjusting the ambient temperature in the initial charging step (A1) or adjusting the type or concentration of an electrolyte, the type of a menstruum in which the electrolyte is dissolved, and the like.

(Aging Process (A2))

Subsequently, the lithium-ion secondary battery is left under a temperature environment ranging of equal to or higher than 30° C. and equal to or lower than 80° C. after the initial charging step (A1).

The ambient temperature in the aging step (A2) ranges of equal to or higher than 30° C. and equal to or lower than 80° C. However, the ambient temperature preferably ranges of equal to or higher than 35° C. and equal to or lower than 70° C. and more preferably ranges of equal to or higher than 40° C. and equal to or lower than 65° C. When the temperature in the aging step (A2) is equal to or lower than the upper limit value, deterioration of the cell characteristics (particularly, charging and discharging capacity) of a lithium-ion secondary battery in the aging step (A2) can be further suppressed. In addition, when the temperature in the aging step (A2) is equal to or higher than the lower limit value, the seed crystal of the conductive foreign substance can grow faster. Therefore, a conductive foreign substance inside a lithium-ion secondary battery can be detected within a shorter period of time.

In addition, when the ambient temperature in the initial charging step (A1) is set to $T_1$ [° C.] and the ambient temperature in the aging step (A2) is set to $T_2$ [° C.], $(T_2-T_1)$ is preferably equal to or higher than 30° C. and is more preferably equal to or higher than 40° C.

In this manner, a conductive foreign substance can be detected with higher sensitivity within a shorter period of time.

In addition, it is preferable that the aging step (A2) is performed without carrying out charging and discharging even once after the initial charging step (A1). In this manner, a conductive foreign substance can be detected within a shorter period of time.

In addition, the voltage of a lithium-ion secondary battery when the aging step (A2) starts is preferably equal to or higher than 3.80 V, is more preferably equal to or higher than 3.90 V, and is particularly preferably equal to or higher than 4.00 V. When the voltage of a lithium-ion secondary battery when the aging step (A2) starts is equal to or higher than the lower limit value, a conductive foreign substance can be detected with higher sensitivity within a shorter period of time.

In addition, the voltage of a lithium-ion secondary battery when the aging step (A2) starts is preferably equal to or lower than 4.40 V, is more preferably equal to or lower than 4.30 V, and is particularly preferably equal to or lower than 4.20 V. When the voltage of a lithium-ion secondary battery when the aging step (A2) starts is equal to or lower than the upper limit value, it is possible to further suppress deterioration of the cell characteristics (particularly, charging and discharging capacity) of a lithium-ion secondary battery in the aging step (A2).

In addition, in the aging step (A2), the lithium-ion secondary battery is preferably left for equal to or longer than two days, is more preferably left for equal to or longer than four days, and is particularly preferably left for equal to or longer than five days. In the aging step (A2), when the lithium-ion secondary battery is left for equal to or higher than the lower limit value, a conductive foreign substance can be detected with higher sensitivity.

In addition, in the aging step (A2), the lithium-ion secondary battery is preferably left for equal to or shorter than ten days leave and is more preferably left for equal to or shorter than eight days. According to the method of manufacturing a lithium-ion secondary battery of the present embodiment, a conductive foreign substance inside a lithium-ion secondary battery can be sensitively detected. Therefore, even though the period of time for being left in the aging step (A2) is equal to or lower than the upper limit value, a lithium-ion secondary battery having a conductive foreign substance incorporated therein can be accurately detected and eliminated, so that it is possible to efficiently obtain a lithium-ion secondary battery in which a short circuit is unlikely to occur between positive and negative electrodes.

In addition, from the viewpoint of being able to detect a conductive foreign substance inside a lithium-ion secondary battery within a shorter period of time, the viscosity of an electrolytic solution in the lithium-ion secondary battery in the aging step (A2) is preferably equal to or lower than 4.5 mPa·s, is more preferably equal to or lower than 4.0 mPa·s, and is particularly preferably equal to or lower than 3.5 mPa·s.

It is assumed that when the viscosity of an electrolytic solution is equal to or lower than the upper limit value, diffusion of ion of a conductive foreign substance in the electrolytic solution becomes favorable, and the seed crystal of a conductive foreign substance can grow faster. Therefore, a conductive foreign substance inside a lithium-ion secondary battery can be detected within a shorter period of time.

For example, the lower limit value for the viscosity of an electrolytic solution in the lithium-ion secondary battery in the aging step (A2) is equal to or higher than 1.5 mPa·s.

Here, the viscosity of an electrolytic solution can be adjusted by adjusting the ambient temperature in the aging step (A2) or adjusting the type or concentration of an electrolyte, the type of a menstruum in which the electrolyte is dissolved, and the like.

(Short Circuit Detecting Process (A3))

Subsequently, the presence or absence of a short circuit of the lithium-ion secondary battery is detected by measuring a voltage drop quantity of the lithium-ion secondary battery and comparing the voltage drop quantity with a reference value. A lithium-ion secondary battery having no short circuit is appraised as a quality product.

The short circuit detecting step (A3) may be performed simultaneously with the aging step (A2) or may be performed after the aging step (A2).

For example, the short circuit detecting step (A3) is performed through self-discharging. A lithium-ion secondary battery is self-discharged by being left at a specified temperature for a predetermined period of time. For example, the specified temperature ranges of equal to or higher than 15° C. and equal to or lower than 40° C. The predetermined period of time preferably ranges of equal to or longer than 1 day and equal to or shorter than 20 days, more preferably ranges of equal to or longer than 2 days and equal to or shorter than 14 days, and particularly preferably ranges of equal to or longer than 3 days and equal to or shorter than 7 days. When the lithium-ion secondary battery is left for equal to or longer than the lower limit value, the voltage drop quantity further increases, so that a conductive foreign substance can be detected with higher accuracy.

In addition, According to the method of manufacturing a lithium-ion secondary battery of the present embodiment, a conductive foreign substance inside a lithium-ion secondary battery can be sensitively detected. Therefore, even though the period of time for being left in the short circuit detecting step (A3) is equal to or lower than the upper limit value, a lithium-ion secondary battery having a conductive foreign substance incorporated therein can be accurately detected and eliminated, so that it is possible to efficiently obtain a lithium-ion secondary battery in which a short circuit is unlikely to occur between positive and negative electrodes.

Most lithium-ion secondary batteries undergo self-discharging which occurs ordinarily due to a reason other than a conductive foreign substance. Therefore, a lithium-ion secondary battery in which abnormal self-discharging greater than self-discharging occurring ordinarily has occurred is determined as a foreign substance-incorporated battery.

For example, the voltage drop quantity can be obtained based on the difference between the voltage before the self-discharging and the voltage after the self-discharging.

When the voltage drop quantity is less than the reference value, the lithium-ion secondary battery is determined to have no short circuit, and it is appraised that no conductive foreign substance is present inside the battery. On the other hand, when the voltage drop quantity is equal to or greater than the reference value, the lithium-ion secondary battery is determined to have a short circuit, and it is appraised that a conductive foreign substance is present inside the battery.

The reference value can be experimentally obtained in advance using a battery having the same specification as the battery to be manufactured. For example, the reference value can be obtained as follows. First, a lithium-ion secondary battery which has been verified in advance for having no conductive foreign substance incorporated and has not been subjected to initial charging is prepared. Next, as described above, the procedure proceeds to a step before the short circuit detecting step (A3).

Subsequently, the voltage before the self-discharging is measured, and then, resistors having predetermined electric resistance are connected to positive electrode and negative electrode terminals. The predetermined electric resistance can be determined based on the size or the electric conduction rate of the conductive foreign substance intended to detect. In a case where the conductive foreign substance intended to detect is small and has low conductivity, it is preferable to use resistors having significant electric resistance.

Subsequently, self-discharging is carried out, and a value of the voltage after the self-discharging is obtained. The difference between the voltage before the self-discharging and the voltage after the self-discharging can be used as a reference value for a battery having the specification described above.

In a case where the short circuit detecting step (A3) is performed after the aging step (A2), it is preferable that the lithium-ion secondary battery is subjected to discharging after the aging step (A2), and the voltage of the lithium-ion secondary battery in the short circuit detecting step (A3) is set to range of equal to or higher than 2.5 V and equal to or lower than 3.8 V. When the voltage of the lithium-ion secondary battery is within the range, the voltage drop quantity due to the self-discharging increases. Therefore, the presence or absence of a short circuit of the lithium-ion secondary battery can be detected with higher accuracy.

(Sorting Process (A4))

Subsequently, a lithium-ion secondary battery having no short circuit detected is sorted out.

Accordingly, it is possible to obtain a highly reliable lithium-ion secondary battery in which a short circuit is unlikely to occur between the positive and negative electrodes.

(Process of Assembling Lithium-Ion Secondary Battery)

Subsequently, a step of assembling a lithium-ion secondary battery which has not been subjected to initial charging will be described.

A lithium-ion secondary battery which has not been subjected to initial charging is not particularly limited and can be produced in accordance with a known method. For example, the lithium-ion secondary battery thereof is manufactured in accordance with a known method by using a positive electrode, a separator, a negative electrode, and an electrolyte.

For example, a layered body or a wound body can be used as the positive electrode and the negative electrode. As an exterior body, a metal exterior body or an aluminum laminate exterior body can be suitably used. The shape of the lithium-ion secondary battery may be any shape of a coin type, a button type, a sheet type, a cylinder type, a square type, a flat type, and the like.

For example, the positive electrode and the negative electrode of the present embodiment can be manufactured as follows.

First, electrode slurry is prepared.

Electrode slurry of the present embodiment can be prepared in accordance with a generally known method. Accordingly, the preparation is not particularly limited. For example, the electrode slurry can be prepared by mixing an active material, a binder, a thickener, and a conductive assistant by means of a mixer and causing the mixture to dispersed or dissolved in a solvent or an aqueous medium.

The mixture ratio of the materials in the electrode slurry is suitably determined in accordance with the purpose of use or the like of a battery.

As the mixer, a known mixer such as a ball mill and a planetary mixer can be used. Accordingly, the mixer is not particularly limited. The mixing method is not particularly limited either, and mixing can be performed in accordance with a known method.

A generally known material can be used as the active material used in the present embodiment. The electrode active material is suitably selected in accordance with the purpose of use or the like of a battery. In addition, when a positive electrode is produced, a positive electrode active material is used, and when a negative electrode is produced, a negative electrode active material is used.

The positive electrode active material of the present embodiment is not particularly limited as long as the material is an ordinary positive electrode active material which can be used for a positive electrode of a lithium-ion secondary battery. However, for example, it is possible to use a material which can reversibly release and store lithium ion and has high electron conductivity such that electron transport can be easily carried out. Examples of the positive electrode active material include composite oxide of lithium and transition metal, such as lithium-nickel composite oxide, lithium-cobalt composite oxide, lithium-manganese composite oxide, lithium-manganese-nickel composite oxide, and lithium-nickel-cobalt-aluminum composite oxide; transition metal sulfide such as $TiS_2$, $FeS$, and $MoS_2$; transition metal oxide such as $MnO$, $V_2O_5$, $V_6O_{13}$, and $TiO_2$; and olivine-type lithium phosphorus oxide.

The negative electrode active material of the present embodiment is not particularly limited as long as the material is an ordinary negative electrode active material which can be used for a negative electrode of a lithium-ion secondary battery. However, examples of the negative electrode active material include carbon materials such as natural graphite, artificial graphite, resin charcoal, carbon fiber, activated carbon, hard carbon, and soft carbon; lithium-based metal such as lithium metal and lithium alloy; metal such as silicon and tin; conductive polymers such as polyacene, polyacetylene, and polypyrrole.

The electrode slurry of the present embodiment may further include a binder which plays a role of binding the active materials, and an active material and a current collector together.

The binder of the present embodiment is not particularly limited as long as the binder is an ordinary binder which can be used for a lithium-ion secondary battery. However, Examples of the binder include polyvinyl alcohol, polyacrylic acid, carboxymethyl cellulose, polytetrafluoroethylene, polyvinylidene fluoride, styrene butadiene-based rubber, and polyimide. These binders may be used alone, or two or more thereof may be used in a combination.

Among the binders described above, due to excellent binding properties, polyvinylidene fluoride or styrene butadiene-based rubber is preferable.

The usage form of the binder of the present embodiment is not particularly limited. However, due to environmental friendliness and excellent binding properties, it is preferable to use a so-called water-based binder which is used in a latex state where the binder is dispersed or dissolved in an aqueous medium.

From the viewpoint of ensuring fluidity suitable for coating, the electrode slurry of the present embodiment may further a thickener. The thickener of the present embodiment is not particularly limited as long as the thickener is an ordinary thickener which can be used for a lithium-ion secondary battery. However, Examples of the thickener include cellulose-based polymers such as carboxymethylcellulose, methylcellulose, and hydroxypropylcellulose, ammonium salts thereof, and alkali metal salt thereof; soluble polymers such as polycarboxylic acid, polyethylene oxide, polyvinyl pyrrolidone, polyacrylic acid salt, and polyvinyl alcohol. These thickeners may be used alone, or two or more thereof may be used in a combination.

The electrode slurry of the present embodiment may further include a conductive assistant. The conductive assistant of the present embodiment is not particularly limited as long as the conductive assistant is an ordinary conductive assistant which can be used for a lithium-ion secondary battery. However, Examples of include carbon materials such as acetylene black, Ketjenblack, carbon black, and vapor-grown carbon fibers.

Subsequently, a current collector is coated with the obtained electrode slurry and is dried.

A generally known method can be used as a method of coating a current collector with electrode slurry. Examples of the coating method can include a reverse roll method, a direct roll method, a doctor blade method, a knife method, an extrusion method, a curtain method, a gravure method, a bar method, a dipping method, and a squeezing method.

Only one surface of the current collector may be coated with the electrode slurry, or both surfaces may be coated. In a case where both surfaces of the current collector are coated, the current collector may be coated successively one surface at a time or both surfaces may be coated at the same time. In addition, the surface of the current collector may be coated continuously or intermittently. The thickness, the length, and the width of a coating layer can be suitably determined in accordance with the size of a battery.

A generally known method can be used as a method of drying coated electrode slurry. Particularly, it is preferable that hot air, vacuum, infrared rays, far infrared rays, electron beams, and warm air are used alone or in a combination. An ordinary drying temperature ranges of equal to or higher than 30° C. and equal to or lower than 350° C.

The current collector used for manufacturing the electrode of the present embodiment is not particularly limited as long as the current collector is an ordinary current collector which can be used for a lithium-ion secondary battery. However, from the viewpoint of price, availability, electrochemical stability, and the like, it is preferable to use aluminum for a positive electrode and copper for a negative electrode. In addition, the shape of the current collector is not particularly limited either. However, for example, it is possible to use a foil current collector having a thickness ranging from 0.001 mm to 0.5 mm.

The electrode for a lithium-ion secondary battery of the present embodiment may be subjected to pressing as necessary. A generally known method can be used as a pressing method. Examples of the pressing method include a die-pressing method and a calendar pressing method. The pressure of pressing is not particularly limited. For example, the pressure ranges from 0.2 $t/cm^2$ to 3 $t/cm^2$.

Compounding of the electrode for a lithium-ion secondary battery the present embodiment is not particularly limited for being suitably determined in accordance with the purpose of use or the like of a battery. The compounding thereof can be set based on generally known information.

The thickness and the density of layers of the positive electrode active material and the negative electrode active material of the present embodiment is not particularly limited for being suitably determined in accordance with the purpose of use or the like of a battery. The thickness and the density thereof can be set based on generally known information.

The lithium-ion secondary battery of the present embodiment can be obtained by layering the positive electrode and the negative electrode, which have been obtained through the above-described procedure, via the separator in an atmosphere of dry air or inert gas, or winding the layered positive electrode and negative electrode, and then by accommodating the result thereof in a battery can or sealing the battery with a flexible film or the like formed of a layered body of synthetic resin and metal foil.

For example, in the lithium-ion secondary battery of the present embodiment, the positive electrode and the negative electrode are disposed face to face via the separator in a state of being dipped in the electrolytic solution.

As the shape of the lithium-ion secondary battery, it is possible to employ various types of shape such as a square type, a paper type, a layer type, a cylinder type, and a coin type. The exterior material and other constituent members are not particularly limited and may be selected in accordance with the shape of a battery.

As the electrolyte in the electrolytic solution of the lithium-ion secondary battery, any known lithium salt can be used. The electrolyte may be selected in accordance with the type of the active material. Examples of the electrolyte include, $LiClO_4$, $LiBF_6$, $LiPF_6$, $LiCF_3SO_3$, $LiCF_3CO_2$, $LiAsF_6$, $LiSbF_6$, $LiB_{10}Cl_{10}$, $LiAlCl_4$, $LiCl$, $LiBr$, $LiB(C_2H_5)_4$, $CF_3SO_3Li$, $CH_3SO_3Li$, $LiCF_3SO_3$, $LiC_4F_9SO_3$, $Li(CF_3SO_2)_2N$, and lower fatty acid lithium carboxylate.

The menstruum in which the electrolyte is dissolved is not particularly limited as long as the menstruum is ordinarily used as liquid in which an electrolyte is dissolved. Examples of the menstruum include carbonates such as ethylene carbonate (EC), propylene carbonate (PC), butylene carbonate (BC), dimethyl carbonate (DMC), diethyl carbonate (DEC), methylethyl carbonate (MEC), and vinylene carbonate (VC); lactones such as γ-butyrolactone and γ-valerolactone; ethers such as trimethoxymethane, 1,2-dimethoxyethane, diethyl ether, 2-ethoxyethane, tetrahydrofuran, and 2-methyltetrahydrofuran; sulfoxides such as dimethylsulfoxide; oxolanes such as 1,3-dioxolane and 4-methyl-1,3-dioxolane; nitrogen-containing compounds such as acetonitrile, nitromethane, formamide, and dimethylformamide; organic acid esters such as methyl formate, methyl acetate, ethyl acetate, butyl acetate, methyl propionate, and ethyl propionate; phosphoric acid triester or diglymes; triglymes; sulfolanes such as sulfolane and methylsulfolane; oxazolidinones such as 3-methyl-2-oxazolidinone; and sultones such as 1,3-propane sultone, 1,4-butane sultone, and naphthasultone. These may be used alone, or two or more thereby may be used in a combination.

Examples of the separator include a porous substrate. Examples of the form of the separator include a membrane, a film, and non-woven fabric.

Examples of the porous separator include polyolefin-based porous separators such as a polypropylene-based porous separator and a polyethylene-based porous separator; and separators such as polyvinylidene fluoride, polyethylene oxide, polyacrylonitrile, and a polyvinylidene fluoride hexafluoropropylene copolymer.

Second Embodiment: Method of Manufacturing Lithium-Ion Secondary Battery

Next, a method of manufacturing a lithium-ion secondary battery according to a second embodiment will be described.

Figure 2:
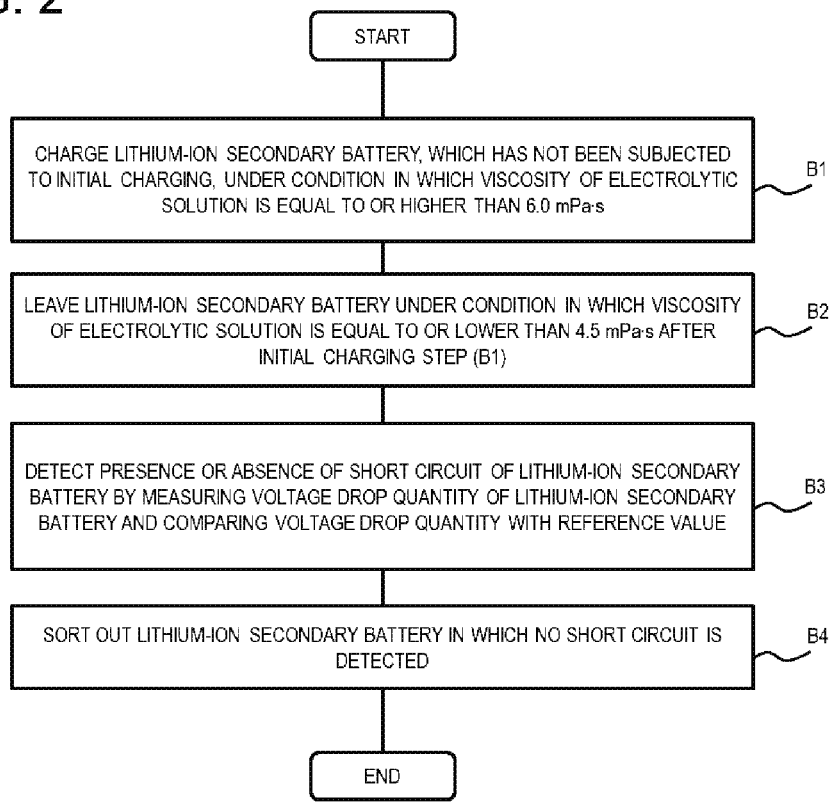
FIG. 2 is a flow chart illustrating an example of a method of manufacturing a lithium-ion secondary battery according to a second embodiment.

FIG. 2 is a flow chart illustrating an example of the method of manufacturing a lithium-ion secondary battery according to the second embodiment.

The method of manufacturing a lithium-ion secondary battery of the present embodiment includes at least four steps (B1) to (B4) as follows:

(B1) an initial charging step of charging the lithium-ion secondary battery, which has not been subjected to initial charging, under a condition in which viscosity of an electrolytic solution is equal to or higher than 6.0 mPa·s;

(B2) an aging step of leaving the lithium-ion secondary battery under a condition in which viscosity of an electrolytic solution is equal to or lower than 4.5 mPa·s after the initial charging step (B1);

(B3) a short circuit detecting step of detecting the presence or absence of a short circuit of the lithium-ion secondary battery by measuring a voltage drop quantity of the lithium-ion secondary battery and comparing the voltage drop quantity with a reference value; and (B4) a sorting step of sorting out a lithium-ion secondary battery in which no short circuit is detected.

According to the method of manufacturing a lithium-ion secondary battery of the present embodiment, when at least the four steps (B1) to (B4) described above are included, a lithium-ion secondary battery having a conductive foreign substance incorporated therein can be detected with high sensitivity, so that it is possible to efficiently obtain a lithium-ion secondary battery in which a short circuit is unlikely to occur between positive and negative electrodes.

Upon investigation of the inventors, it has become clear that the method disclosed in Patent Document 1 has low sensitivity for detecting a conductive foreign, for example, it is not possible to detect a lithium-ion secondary battery, within a practical period of time, in which a minute amount of stainless steel having a high risk of being incorporated during a manufacturing step is incorporated.

Thus, the inventors have intensively and repetitively investigated in order to achieve the objects described above. As a result, it has been found that sensitivity for detecting a conductive foreign substance inside a lithium-ion secondary battery is improved by adjusting the viscosity of an electrolytic solution in the lithium-ion secondary battery in the initial charging step (B1) and the aging step (B2) respectively within particular ranges, and the present invention has been completed.

That is, in the method of manufacturing a lithium-ion secondary battery of the present embodiment, as described above, the viscosity of an electrolytic solution in the lithium-ion secondary battery in the initial charging step (B1) and the aging step (B2) is adjusted to the particular ranges. It is assumed that when the viscosity of an electrolytic solution in the lithium-ion secondary battery in the initial charging step (B1) is within the range described above, seed crystal of a precipitate of a conductive foreign substance can be formed in an acute-angled manner. In addition, it is assumed that when the viscosity of an electrolytic solution in the lithium-ion secondary battery in the aging step (B2) is within the range described above, the seed crystal can grow effectively while the acute-angled form is maintained.

For the reason described above, according to the method of manufacturing a lithium-ion secondary battery of the present embodiment, it is possible to accurately detect and eliminate a lithium-ion secondary battery in which a conductive foreign substance, such as stainless steel that is difficult to be detected by a detection technology in the related art, having a high risk of being incorporated during a manufacturing step is incorporated. That is, according to the method of manufacturing a lithium-ion secondary battery of the present embodiment, it is possible to remove a lithium-ion secondary battery as a defective unit in which a short circuit occurs between the positive and negative electrodes due to a precipitate of a conductive foreign substance so that deterioration of battery performance is likely to occur in a later stage in a case where a force is applied such that the positive electrode and the negative electrode approach each other when in actual use or in a case of being used for a long period of time even though no defect has occurred at the time of inspection. Therefore, it is possible to efficiently obtain a highly reliable lithium-ion secondary battery in which a short circuit is unlikely to occur between the positive and negative electrodes.

Hereinafter, each of the steps will be described.

(Initial Charging Process (B1))

First, a lithium-ion secondary battery which has not been subjected to initial charging is charged under a condition in which viscosity of an electrolytic solution is equal to or higher than 6.0 mPa·s.

The initial charging step (B1) is a step in which a lithium-ion secondary battery in a state where assembling is completed (an electrolytic solution is injected, and the battery is sealed) is charged for the first time to a predetermined capacity. It is preferable that charging in the initial charging step (B1) is carried out by constant current/constant voltage charging (CCCV charging).

The viscosity of an electrolytic solution in the lithium-ion secondary battery in the initial charging step (B1) is equal to or higher than 6.0 mPa·s. However, from the viewpoint of being able to further improve sensitivity for detecting a conductive foreign substance, the viscosity is more preferably equal to or higher than 7.0 mPa·s.

It is assumed that when the viscosity of an electrolytic solution is equal to or higher than the lower limit value, diffusion of ion of a conductive foreign substance in the electrolytic solution is suppressed, and seed crystal of a precipitate of a conductive foreign substance can be formed in an acuter-angled manner, so that sensitivity for detecting a conductive foreign substance can be improved.

For example, the upper limit value for the viscosity of an electrolytic solution in the lithium-ion secondary battery in the initial charging step (B1) is equal to or lower than 15 mPa·s.

Here, the viscosity of an electrolytic solution in the lithium-ion secondary battery can be adjusted by adjusting the ambient temperature in the initial charging step (B1) or adjusting the type or concentration of an electrolyte, the type of a menstruum in which the electrolyte is dissolved, and the like.

(Aging Process (B2))

Subsequently, the lithium-ion secondary battery is left under a condition in which viscosity of an electrolytic solution is equal to or lower than 4.5 mPa·s after the initial charging step (B1).

The viscosity of an electrolytic solution in the lithium-ion secondary battery in the aging step (B2) is equal to or lower than 4.5 mPa·s. However, from the viewpoint of being able to detect a conductive foreign substance inside a lithium-ion secondary battery within a shorter period of time, the viscosity is preferably equal to or lower than 4.0 mPa·s and is particularly preferably equal to or lower than 3.5 mPa·s.

It is assumed that when the viscosity of an electrolytic solution is equal to or lower than the upper limit value, diffusion of ion of a conductive foreign substance in the electrolytic solution becomes favorable, and the seed crystal of a conductive foreign substance can grow faster. Therefore, a conductive foreign substance inside a lithium-ion secondary battery can be detected within a shorter period of time.

For example, the lower limit value for the viscosity of an electrolytic solution in the lithium-ion secondary battery in the aging step (B2) is equal to or higher than 1.5 mPa·s.

Here, the viscosity of an electrolytic solution can be adjusted by adjusting the ambient temperature in the aging step (B2) or adjusting the type or concentration of an electrolyte, the type of a menstruum in which the electrolyte is dissolved, and the like.

In addition, it is preferable that the aging step (B2) is performed without carrying out charging and discharging even once after the initial charging step (B1). In this manner, a conductive foreign substance can be detected within a shorter period of time.

In addition, the voltage of a lithium-ion secondary battery when the aging step (B2) starts is preferably equal to or higher than 3.80 V, is more preferably equal to or higher than 3.90 V, and is particularly preferably equal to or higher than 4.00 V. When the voltage of a lithium-ion secondary battery when the aging step (B2) starts is equal to or higher than the lower limit value, a conductive foreign substance can be detected with higher sensitivity within a shorter period of time.

In addition, the voltage of a lithium-ion secondary battery when the aging step (B2) starts is preferably equal to or lower than 4.40 V, is more preferably equal to or lower than 4.30 V, and is particularly preferably equal to or lower than 4.20 V. When the voltage of a lithium-ion secondary battery when the aging step (B2) starts is equal to or lower than the upper limit value, it is possible to further suppress deterioration of the cell characteristics (particularly, charging and discharging capacity) of a lithium-ion secondary battery in the aging step (B2).

In addition, in the aging step (B2), the lithium-ion secondary battery is preferably left for equal to or longer than two days, is more preferably left for equal to or longer than four days, and is particularly preferably left for equal to or longer than five days. In the aging step (B2), when the lithium-ion secondary battery is left for equal to or higher than the lower limit value, a conductive foreign substance can be detected with higher sensitivity.

In addition, in the aging step (B2), the lithium-ion secondary battery is preferably left for equal to or shorter than ten days leave and is more preferably left for equal to or shorter than eight days. According to the method of manufacturing a lithium-ion secondary battery of the present embodiment, a conductive foreign substance inside a lithium-ion secondary battery can be sensitively detected. Therefore, even though the period of time for being left in the aging step (B2) is equal to or lower than the upper limit value, a lithium-ion secondary battery having a conductive foreign substance incorporated therein can be accurately detected and eliminated, so that it is possible to efficiently obtain a lithium-ion secondary battery in which a short circuit is unlikely to occur between positive and negative electrodes.

(Short Circuit Detecting Process (B3), Sorting Process (B4), and Process of Assembling Lithium-Ion Secondary Battery)

The short circuit detecting step (B3), the sorting step (B4), and the step of assembling a lithium-ion secondary battery can be respectively performed in accordance with the short circuit detecting step (A3), the sorting step (A4), and the step of assembling a lithium-ion secondary battery in the method of manufacturing a lithium-ion secondary battery according to the first embodiment. The detailed description will not be repeated herein.

Third Embodiment: Method of Evaluating Lithium-Ion Secondary Battery

Figure 3:
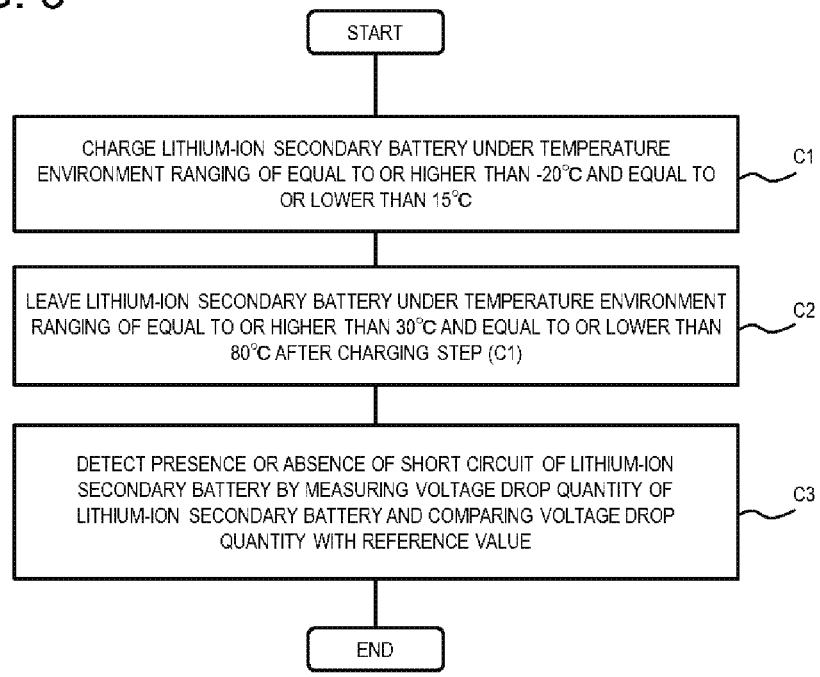
FIG. 3 is a flow chart illustrating an example of a method of evaluating a lithium-ion secondary battery according to a third embodiment.

Next, a method of evaluating a lithium-ion secondary battery according to a third embodiment will be described. FIG. 3 is a flow chart illustrating an example of the method of evaluating a lithium-ion secondary battery according to the third embodiment.

The method of evaluating a lithium-ion secondary battery of the present embodiment includes at least three steps (C1) to (C3) as follows:

(C1) a charging step of charging the lithium-ion secondary battery under a temperature environment ranging of equal to or higher than −20° C. and equal to or lower than 15° C.;

(C2) an aging step of leaving the lithium-ion secondary battery under a temperature environment ranging of equal to or higher than 30° C. and equal to or lower than 80° C. after the charging step (C1); and (C3) a short circuit detecting step of detecting the presence or absence of a short circuit of the lithium-ion secondary battery by measuring a voltage drop quantity of the lithium-ion secondary battery and comparing the voltage drop quantity with a reference value.

According to the method of evaluating a lithium-ion secondary battery of the present embodiment, when at least the three steps (C1) to (C3) described above are included, it is possible to accurately detect a lithium-ion secondary battery in which a short circuit is likely to occur between positive and negative electrodes.

Upon investigation of the inventors, it has become clear that the method disclosed in Patent Document 1 has low sensitivity for detecting a conductive foreign, for example, it is not possible to detect a lithium-ion secondary battery, within a practical period of time, in which a minute amount of stainless steel having a high risk of being incorporated during a manufacturing step is incorporated.

Thus, the inventors have intensively and repetitively investigated in order to achieve the objects described above. As a result, it has been found that sensitivity for detecting a conductive foreign substance inside a lithium-ion secondary battery is improved by respectively performing the charging step (C1) and the aging step (C2) within particular temperature ranges, and the present invention has been completed.

That is, in method of evaluating a lithium-ion secondary battery of the present embodiment, as described above, the ambient temperature in the charging step (C1) and the aging step (C2) are respectively adjusted to particular ranges. It is assumed that when the ambient temperature in the charging step (C1) is within the range described above, seed crystal of a precipitate of a conductive foreign substance can be formed in an acute-angled manner. In addition, it is assumed that when the ambient temperature in the aging step (C2) is within the range described above, the seed crystal can grow effectively while the acute-angled form is maintained.

For the reason described above, according to the method of evaluating a lithium-ion secondary battery of the present embodiment, it is possible to efficiently detect a lithium-ion secondary battery in which a conductive foreign substance, such as stainless steel that is difficult to be detected by a detection technology in the related art, having a high risk of being incorporated during a manufacturing step is incorporated. That is, according to the method of evaluating a lithium-ion secondary battery of the present embodiment, it is possible to detect a lithium-ion secondary battery in which a short circuit occurs between the positive and negative electrodes due to a precipitate of a conductive foreign substance so that deterioration of battery performance is likely to occur in a later stage in a case where a force is applied such that the positive electrode and the negative electrode approach each other when in actual use or in a case of being used for a long period of time.

Hereinafter, each of the steps will be described.

(Charging Process (C1))

First, a lithium-ion secondary battery is charged under a temperature environment ranging of equal to or higher than −20° C. and equal to or lower than 15° C.

The charging step (C1) is a step in which a lithium-ion secondary battery is charged to a predetermined capacity. It is preferable that charging in the charging step (C1) is carried out by constant current/constant voltage charging (CCCV charging).

The ambient temperature in the charging step (C1) ranges of equal to or higher than −20° C. and equal to or lower than 15° C. However, the ambient temperature preferably ranges of equal to or higher than −10° C. and equal to or lower than 10° C. and more preferably ranges of equal to or higher than −8° C. and equal to or lower than 8° C. When the temperature in the charging step (C1) is equal to or lower than the upper limit value, it is assumed that seed crystal of a precipitate of a conductive foreign substance can be formed in an acuter-angled manner. In addition, when the temperature in the charging step (C1) is equal to or higher than the lower limit value, deterioration of the cell characteristics (particularly, charging and discharging capacity) of a lithium-ion secondary battery in the charging step (C1) can be further suppressed.

In addition, from the viewpoint of being able to improve sensitivity for detecting a conductive foreign substance, the viscosity of an electrolytic solution in the lithium-ion secondary battery in the charging step (C1) is preferably equal to or higher than 6.0 mPa·s and is more preferably equal to or higher than 7.0 mPa·s.

It is assumed that when the viscosity of an electrolytic solution is equal to or higher than the lower limit value, diffusion of ion of a conductive foreign substance in the electrolytic solution is suppressed, and seed crystal of a precipitate of a conductive foreign substance can be formed in an acuter-angled manner, so that sensitivity for detecting a conductive foreign substance can be improved.

The upper limit value for the viscosity of an electrolytic solution in the lithium-ion secondary battery in the charging step (C1) is equal to or lower than 15 mPa·s.

Here, the viscosity of an electrolytic solution in the lithium-ion secondary battery can be adjusted by adjusting the ambient temperature in the charging step (C1) or adjusting the type or concentration of an electrolyte, the type of a menstruum in which the electrolyte is dissolved, and the like.

(Aging Process (C2) and Short Circuit Detecting Process (C3))

The aging step (C2) and the short circuit detecting step (C3) can be respectively performed in accordance with the aging step (A2) and the short circuit detecting step (A3) in the method of manufacturing a lithium-ion secondary battery according to the first embodiment. The detailed description will not be repeated herein.

Fourth Embodiment: Method of Evaluating Lithium-Ion Secondary Battery

Next, a method of evaluating a lithium-ion secondary battery according to a fourth embodiment will be described.

Figure 4:
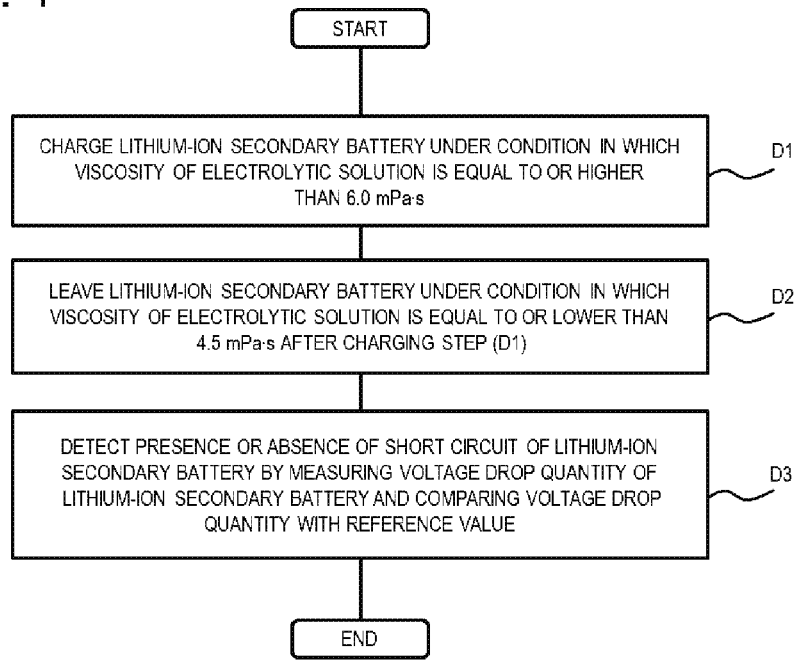
FIG. 4 is a flow chart illustrating an example of a method of evaluating a lithium-ion secondary battery according to a fourth embodiment.

FIG. 4 is a flow chart illustrating an example of the method of evaluating a lithium-ion secondary battery according to the fourth embodiment.

The method of evaluating a lithium-ion secondary battery of the present embodiment includes at least three steps (D1) to (D3) as follows:

(D1) a charging step of charging the lithium-ion secondary battery under a condition in which viscosity of an electrolytic solution is equal to or higher than 6.0 mPa·s;

(D2) an aging step of leaving the lithium-ion secondary battery under a condition in which viscosity of an electrolytic solution is equal to or lower than 4.5 mPa·s after the charging step (D1); and (D3) a short circuit detecting step of detecting the presence or absence of a short circuit of the lithium-ion secondary battery by measuring a voltage drop quantity of the lithium-ion secondary battery and comparing the voltage drop quantity with a reference value.

According to the method of evaluating a lithium-ion secondary battery of the present embodiment, when at least the three steps (D1) to (D3) described above are included, it is possible to accurately detect a lithium-ion secondary battery in which a short circuit is likely to occur between positive and negative electrodes.

Upon investigation of the inventors, it has become clear that the method disclosed in Patent Document 1 has low sensitivity for detecting a conductive foreign, for example, it is not possible to detect a lithium-ion secondary battery, within a practical period of time, in which a minute amount of stainless steel having a high risk of being incorporated during a manufacturing step is incorporated.

Thus, the inventors have intensively and repetitively investigated in order to achieve the objects described above. As a result, it has been found that sensitivity for detecting a conductive foreign substance inside a lithium-ion secondary battery is improved by adjusting the viscosity of an electrolytic solution in the lithium-ion secondary battery in the charging step (D1) and the aging step (D2) respectively within particular ranges, and the present invention has been completed.

That is, in method of evaluating a lithium-ion secondary battery of the present embodiment, as described above, the viscosity of an electrolytic solution in the lithium-ion secondary battery in the charging step (D1) and the aging step (D2) is adjusted to the particular ranges. It is assumed that when the viscosity of an electrolytic solution in the lithium-ion secondary battery in the charging step (D1) is within the range described above, seed crystal of a precipitate of a conductive foreign substance can be formed in an acute-angled manner. In addition, it is assumed that when the viscosity of an electrolytic solution in the lithium-ion secondary battery in the aging step (D2) is within the range described above, the seed crystal can grow effectively while the acute-angled form is maintained.

For the reason described above, according to the method of evaluating a lithium-ion secondary battery of the present embodiment, it is possible to accurately detect a lithium-ion secondary battery in which a conductive foreign substance, such as stainless steel that is difficult to be detected by a detection technology in the related art, having a high risk of being incorporated during a manufacturing step is incorporated. That is, according to the method of evaluating a lithium-ion secondary battery of the present embodiment, it is possible to detect a lithium-ion secondary battery in which a short circuit occurs between the positive and negative electrodes due to a precipitate of a conductive foreign substance so that deterioration of battery performance is likely to occur in a later stage in a case where a force is applied such that the positive electrode and the negative electrode approach each other when in actual use or in a case of being used for a long period of time.

Hereinafter, each of the steps will be described.

(Charging Process (D1))

First, a lithium-ion secondary battery is charged under a condition in which viscosity of an electrolytic solution is equal to or higher than 6.0 mPa·s.

The charging step (D1) is a step in which a lithium-ion secondary battery is charged to a predetermined capacity. It is preferable that charging in the charging step (D1) is carried out by constant current/constant voltage charging (CCCV charging).

The viscosity of an electrolytic solution in the lithium-ion secondary battery in the charging step (D1) is equal to or higher than 6.0 mPa·s. However, from the viewpoint of being able to further improve sensitivity for detecting a conductive foreign substance, the viscosity is more preferably equal to or higher than 7.0 mPa·s.

It is assumed that when the viscosity of an electrolytic solution is equal to or higher than the lower limit value, diffusion of ion of a conductive foreign substance in the electrolytic solution is suppressed, and seed crystal of a precipitate of a conductive foreign substance can be formed in an acuter-angled manner, so that sensitivity for detecting a conductive foreign substance can be improved.

For example, the upper limit value for the viscosity of an electrolytic solution in the lithium-ion secondary battery in the charging step (D1) is equal to or lower than 15 mPa·s.

Here, the viscosity of an electrolytic solution in the lithium-ion secondary battery can be adjusted by adjusting the ambient temperature in the charging step (D1) or adjusting the type or concentration of an electrolyte, the type of a menstruum in which the electrolyte is dissolved, and the like.

(Aging Process (D2))

The aging step (D2) can be performed in accordance with the aging step (B2) in the method of manufacturing a lithium-ion secondary battery according to the second embodiment. The detailed description will not be repeated herein.

(Short Circuit Detecting Process (D3))

The short circuit detecting step (D3) can be performed in accordance with the short circuit detecting step (A3) in the method of manufacturing a lithium-ion secondary battery according to the first embodiment. The detailed description will not be repeated herein.

The present invention is not limited to the embodiments, and changes, improvements, and the like are included in the present invention within the scope in which the objects of the present invention can be achieved.

EXEMPLARY EMBODIMENT

Hereinafter, the present invention will be described through Exemplary Embodiments and Comparative Examples. However, the present invention is not limited thereto.

Exemplary Embodiment 1

1. Assembling of Lithium-Ion Secondary Battery
(Production of Positive Electrode)

Composite oxide having $LiMn_2O_4$ and $LiNi_{0.8}Co_{0.1}Al_{0.1}O_2$ as main components was used as a positive electrode active material. Carbon black was used as a conductive assistant. Polyvinylidene fluoride (PVdF) was used as a binder. Those were dispersed in N-methyl-2-pyrrolidone, and slurry was prepared. Aluminum foil which served as a positive electrode current collector and had a thickness of 20 µm was continuously coated with this slurry and was dried. Then, a positive electrode roll provided with the positive electrode current collector having a coated portion and an uncoated portion, which was not coated, was produced.

This positive electrode roll was punched leaving the uncoated portion which would serve as a tab to be connected to a positive electrode terminal, such that the dimensions excluding a positive electrode tab became the height of 125 mm and the width of 65 mm, and then a positive electrode was obtained.

Subsequently, a stainless steel ball (diameter of 200 µm) was pressed into the coated portion of a part of the positive electrode using a glass plate.

(Production of Negative Electrode)

Artificial graphite (average particle size $d_{50}$: 20 µm) was used as a negative electrode active material. Carboxymethyl cellulose was used as a thickener. Styrene butadiene-based rubber was used as a binder. Acetylene black was used as a conductive assistant. Those were dispersed in water, and slurry was prepared. Copper foil which served as a negative electrode current collector and had a thickness of 10 µm was continuously coated with this slurry and was dried. Then, a negative electrode roll provided with the negative electrode current collector having a coated portion and an uncoated portion, which was not coated, was produced.

This negative electrode roll was punched leaving the uncoated portion which would serve as a tab to be connected to a negative electrode terminal, such that the dimensions excluding a negative electrode tab became the height of 130 mm and the width of 70 mm, and then a negative electrode was realized.

(Assembling of Layered-Type Laminate Battery)

One positive electrode in which the stainless steel ball was embedded, five positive electrodes in which no stainless steel ball was embedded, seven negative electrodes, and twelve separators (microporous polyethylene films having thicknesses of 25 µm) were prepared forming a set of [negative electrode-separator-positive electrode having no stainless steel ball embedded-separator]. After four sets thereof were layered, a set of [negative electrode-separator-positive electrode having a stainless steel ball embedded-separator] was layered. Lastly, a set of [negative electrode-separator-positive electrode having no stainless steel ball embedded-separator-negative electrode] was layered. The negative electrode terminal or the positive electrode terminal was provided therein, and a layered body with a SUS ball was obtained. Subsequently, an electrolytic solution and the obtained layered body was accommodated in a flexible film, so that a layered-type laminate battery (2 Ah cell), that is, a lithium-ion secondary battery was obtained. Here, the electrolytic solution was obtained by causing $LiPF_6$ (lithium salt) to be dissolved in a mixed menstruum obtained by mixing ethylene carbonate (EC) and diethyl carbonate (DEC) by 30:70 (volume ratio), such that 1.0 mol/L was realized.

2. Charging/Discharging Test of Layered-Type Laminate Battery

A laminate battery which had not been subjected to initial charging was subjected to CCCV charging under the temperature environment of 5° C. and conditions of the charge current of 0.25 ItA, the upper limit voltage of 4.05 V, and the total charging time of 360 minutes (initial charging step). Subsequently, the laminate battery subjected to the initial charging was left at 50° C. for seven days without carrying out charging and discharging even once after the initial charging step (aging step). Subsequently, the laminate battery was subjected to constant current discharging under conditions of the lower limit voltage of 2.5 V and the discharge current of 0.3 ItA and then was charged for 60 minutes under conditions of the voltage of 3.3 V and the charge current of 0.3 ItA. Subsequently, the laminate battery was left at 25° C. for fourteen days for self-discharging (short circuit detecting step). In this case, the difference between the voltage of the second day after being left and the voltage of the fourteenth day after being left (voltage drop quantity) was investigated.

Here, a battery of which the voltage drop quantity was equal to or more than 10 mV was determined to have a short circuit, and a battery of which thereof was less than 10 mV was determined to have no short circuit.

Exemplary Embodiments 2 to 4 and Comparative Examples 1 to 6

The voltage drop quantities were investigated in a manner similar to that in Exemplary Embodiment 1 except for the ambient temperature in the initial charging step, the charge voltage in the initial charging step, the ambient temperature in the aging step, and the days of being left in the aging step which were varied to the values shown in Table 1.

In Table 1, as the viscosity of an electrolytic solution, viscosity measured by using a tuning fork viscometer (manufactured by SEKONIC CORPORATION, brand name: Visco Mate VM-100) is indicated, and the values are measured at the ambient temperature in each of the steps.

TABLE 1

| | Ambient temperature $T_1$ in initial charging step [° C.] | Viscosity of electrolytic solution in initial charging step [mPa·s] | Charge voltage in initial charging step [V] | Ambient temperature $T_2$ in aging step [° C.] | Viscosity of electrolytic solution in aging step [mPa·s] | $T_2-T_1$ [° C.] | Days being left in aging step [day] | Voltage drop quantity [mV] | Short circuit |
|---|---|---|---|---|---|---|---|---|---|
| Example 1 | 5 | 7.5 | 4.05 | 50 | 2.9 | 45 | 7 | 292 | Present |
| Example 2 | 5 | 7.5 | 4.20 | 50 | 2.9 | 45 | 7 | 61 | Present |
| Example 3 | 5 | 7.5 | 4.05 | 55 | 2.7 | 50 | 7 | 421 | Present |
| Example 4 | −5 | 9.7 | 4.05 | 40 | 3.5 | 45 | 7 | 127 | Present |
| Comparative Example 1 | 5 | 7.5 | 4.05 | 25 | 4.8 | 20 | 7 | 2 | Absent |
| Comparative Example 2 | 5 | 7.5 | 4.05 | 25 | 4.8 | 20 | 14 | 2 | Absent |
| Comparative Example 3 | 5 | 7.5 | 4.05 | 25 | 4.8 | 20 | 21 | 3 | Absent |

TABLE 1-continued

|  | Ambient temperature $T_1$ in initial charging step [° C.] | Viscosity of electrolytic solution in initial charging step [mPa·s] | Charge voltage in initial charging step [V] | Ambient temperature $T_2$ in aging step [° C.] | Viscosity of electrolytic solution in aging step [mPa·s] | $T_2-T_1$ [° C.] | Days being left in aging step [day] | Voltage drop quantity [mV] | Short circuit |
|---|---|---|---|---|---|---|---|---|---|
| Comparative Example 4 | 5 | 7.5 | 4.20 | 25 | 4.8 | 20 | 7 | 2 | Absent |
| Comparative Example 5 | 25 | 4.8 | 4.05 | 50 | 2.9 | 25 | 7 | 7 | Absent |
| Comparative Example 6 | 45 | 3.2 | 4.05 | 50 | 2.9 | 5 | 7 | 5 | Absent |

As shown in Table 1, according to the method disclosed in Exemplary Embodiments, a short circuit due to stainless steel could be detected. That is, it is found that it is possible to detect and eliminate, within a short period of time, a lithium-ion secondary battery in which a conductive foreign substance, such as stainless steel that is difficult to be detected by a detection technology in the related art, having a high risk of being incorporated during a manufacturing step is incorporated. Thus, according to the method of manufacturing a lithium-ion secondary battery of the present invention, it is found that it is possible to efficiently obtain a highly reliable lithium-ion secondary battery in which a short circuit is unlikely to occur between the positive and negative electrodes.

Meanwhile, in the methods disclosed in Comparative Examples, a short circuit due to stainless steel could not be detected. That is, it is found that it is difficult to detect and eliminate, within a short period of time, a lithium-ion secondary battery in which a conductive foreign substance, such as stainless steel having a high risk of being incorporated during a manufacturing step is incorporated.

The invention claimed is:

1. A method of determining whether a lithium-ion secondary battery is a quality product or a defective unit, the method comprising:
an initial charging step of charging the lithium-ion secondary battery, which has not been subjected to an initial charging, under a temperature environment ranging of equal to or higher than −20° C. and equal to or lower than 15° C.;
an aging step of leaving the lithium-ion secondary battery subjected to the initial charging step under a temperature environment ranging of equal to or higher than 30° C. and equal to or lower than 80° C. after the initial charging step;
a short circuit detecting step of detecting for a short circuit in the lithium-ion secondary battery subjected to the aging step by measuring a voltage drop quantity of the lithium-ion secondary battery and comparing the measured voltage drop quantity with a predetermined reference value; and
a determining step of determining that the lithium-ion secondary battery subjected to said short circuit detecting step is the quality product when the short circuit in the lithium-ion secondary battery is not detected, and determining that the lithium-ion secondary battery subjected to said short circuit detecting step is the defective unit when the short circuit in the lithium-ion secondary battery is detected, and
wherein a viscosity of an electrolytic solution in the lithium-ion secondary battery in the initial charging step is equal to or higher than 6.0 mPa·s.

2. The method of determining whether a lithium-ion secondary batter is a quality product or a defective unit according to claim 1,
wherein ($T_2-T_1$) is equal to or higher than 30° C. when an ambient temperature in the initial charging step is set to $T_1$ and an ambient temperature in the aging step is set to $T_2$.

3. The method of determining whether a lithium-ion secondary batter is a quality product or a defective unit according to claim 1,
wherein the aging step is performed without carrying out charging and discharging even once after the initial charging step.

4. The method of determining whether a lithium-ion secondary batter is a quality product or a defective unit according to claim 1,
wherein a voltage of the lithium-ion secondary battery when the aging step starts is equal to or higher than 3.80 V.

5. The method of determining whether a lithium-ion secondary batter is a quality product or a defective unit according to claim 1,
wherein in the aging step, the lithium-ion secondary battery is left for equal to or longer than two days.

6. The method of determining whether a lithium-ion secondary batter is a quality product or a defective unit according to claim 1,
wherein the lithium-ion secondary battery is subjected to discharging after the aging step, and a voltage of the lithium-ion secondary battery in the short circuit detecting step is set to range of equal to or higher than 2.5 V and equal to or lower than 3.8 V.

7. The method of determining whether a lithium-ion secondary batter is a quality product or a defective unit according to claim 1,
wherein a viscosity of an electrolytic solution in the lithium-ion secondary battery in the aging step is equal to or lower than 4.5 mPa·s.

8. A method of determining whether a lithium-ion secondary battery is a quality product or a defective unit, the method comprising:
an initial charging step of charging the lithium-ion secondary battery, which has not been subjected to an initial charging, under a temperature environment ranging of equal to or higher than −20° C. and equal to or lower than 15° C.;
an aging step of leaving the lithium-ion secondary battery subjected to the initial charging step under a temperature environment ranging of equal to or higher than 30° C. and equal to or lower than 80° C. after the initial charging step;
a short circuit detecting step of detecting for a short circuit in the lithium-ion secondary battery subjected to the aging step by measuring a voltage drop quantity of the lithium-ion secondary battery and comparing the measured voltage drop quantity with a predetermined reference value; and a determining step of determining that the lithium-ion secondary battery subjected to said short circuit detecting step is the quality product when the short circuit in the lithium-ion secondary battery is not detected, and determining that the lithium-ion secondary battery subjected to said short circuit detecting step is the defective unit when the short circuit in the lithium-ion secondary battery is detected, and wherein a viscosity of an electrolytic solution in the lithium-ion secondary battery in the aging step is equal to or lower than 4.5 mPa·s.

9. The method of determining whether a lithium-ion secondary battery is a quality product or a defective unit according to claim 8, wherein $(T_2-T_1)$ is equal to or higher than 30° C. when an ambient temperature in the initial charging step is set to $T_1$ and an ambient temperature in the aging step is set to $T_2$.

10. The method of determining whether a lithium-ion secondary battery is a quality product or a defective unit according to claim 8, wherein the aging step is performed without carrying out charging and discharging even once after the initial charging step.

11. The method of determining whether a lithium-ion secondary battery is a quality product or a defective unit according to claim 8, wherein a voltage of the lithium-ion secondary battery when the aging step starts is equal to or higher than 3.80 V.

12. The method of determining whether a lithium-ion secondary battery is a quality product or a defective unit according to claim 8, wherein in the aging step, the lithium-ion secondary battery is left for equal to or longer than two days.

13. The method of determining whether a lithium-ion secondary battery is a quality product or a defective unit according to claim 8, wherein the lithium-ion secondary battery is subjected to discharging after the aging step, and a voltage of the lithium-ion secondary battery in the short circuit detecting step is set to range of equal to or higher than 2.5 V and equal to or lower than 3.8 V.

14. The method of determining whether a lithium-ion secondary battery is a quality product or a defective unit according to claim 13, wherein a viscosity of an electrolytic solution in the lithium-ion secondary battery in the initial charging step is equal to or higher than 6.0 mPa·s.

\* \* \* \* \*